(12) United States Patent
Karles et al.

(10) Patent No.: US 7,478,637 B2
(45) Date of Patent: Jan. 20, 2009

(54) CONTINUOUS PROCESS FOR SURFACE MODIFICATION OF CIGARETTE FILTER MATERIALS

(75) Inventors: Georgios D. Karles, Richmond, VA (US); Yezdi B. Pithawalla, Richmond, VA (US)

(73) Assignee: Philip Morris USA Inc., Richmond, VA (US)

( * ) Notice: Subject to any disclaimer, the term of this patent is extended or adjusted under 35 U.S.C. 154(b) by 673 days.

(21) Appl. No.: 10/984,637

(22) Filed: Nov. 9, 2004

(65) Prior Publication Data
US 2006/0096605 A1 May 11, 2006

(51) Int. Cl.
*A24C 1/20* (2006.01)
(52) U.S. Cl. .................. 131/207; 131/364
(58) Field of Classification Search .......... 131/280, 131/334, 364, 207
See application file for complete search history.

(56) References Cited

U.S. PATENT DOCUMENTS

| | | | |
|---|---|---|---|
| 5,065,697 A | 11/1991 | Yoshida et al. | |
| 5,192,580 A | 3/1993 | Blanchet-Fincher | |
| 5,206,216 A | 4/1993 | Yoshida | |
| 5,242,706 A | 9/1993 | Cotell et al. | |
| 5,324,552 A | 6/1994 | Opower et al. | |
| 5,409,537 A | 4/1995 | Poullos et al. | |
| 5,411,592 A | 5/1995 | Ovshinsky et al. | |
| 5,522,955 A | 6/1996 | Brodd | |
| 5,580,655 A | 12/1996 | El-Shall et al. | |
| 5,695,617 A | 12/1997 | Graiver et al. | |
| 6,136,156 A | 10/2000 | El-Shall et al. | |
| 6,154,599 A | 11/2000 | Rey | |
| 6,368,406 B1 | 4/2002 | Deevi et al. | |
| 2003/0121887 A1 | 7/2003 | Garvey et al. | |
| 2003/0145681 A1 | 8/2003 | El-Shall et al. | |
| 2004/0140296 A1 | 7/2004 | Lis | |
| 2004/0200491 A1 | 10/2004 | Karles et al. | |
| 2005/0263163 A1 * | 12/2005 | Yadav et al. | ................. 131/334 |

FOREIGN PATENT DOCUMENTS

| | | |
|---|---|---|
| WO | WO-03/053177 | 7/2003 |
| WO | WO-2005/039329 | 5/2005 |

* cited by examiner

*Primary Examiner*—Carlos Lopez
(74) *Attorney, Agent, or Firm*—Connolly Bove Lodge & Hutz LLP

(57) ABSTRACT

Process and apparatus are provided for depositing target materials onto the surface of a moving substrate which may be used in the preparation of composites, cigarette filters, cigarette wrapper, bandages, biomedical applications, cosmetic and cleaning materials, and the like. A moving substrate comprising a fibrous mat or paper passes through one or more reaction chambers each having hot and cold regions. At least one target material is positioned in the hot region, and a laser beam ablates the material thereby producing modified additive material. As the substrate moves through the cold region of the reaction chamber, the modified additive material adheres to the exposed surface of the substrate.

24 Claims, 4 Drawing Sheets

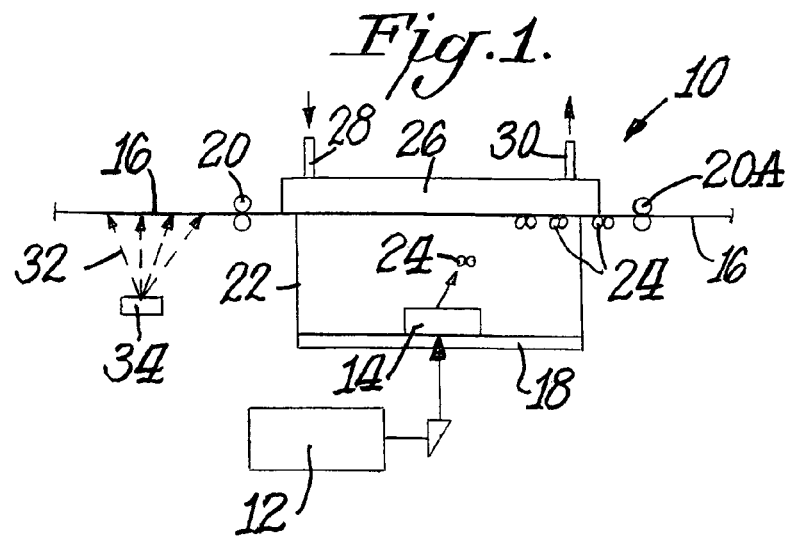
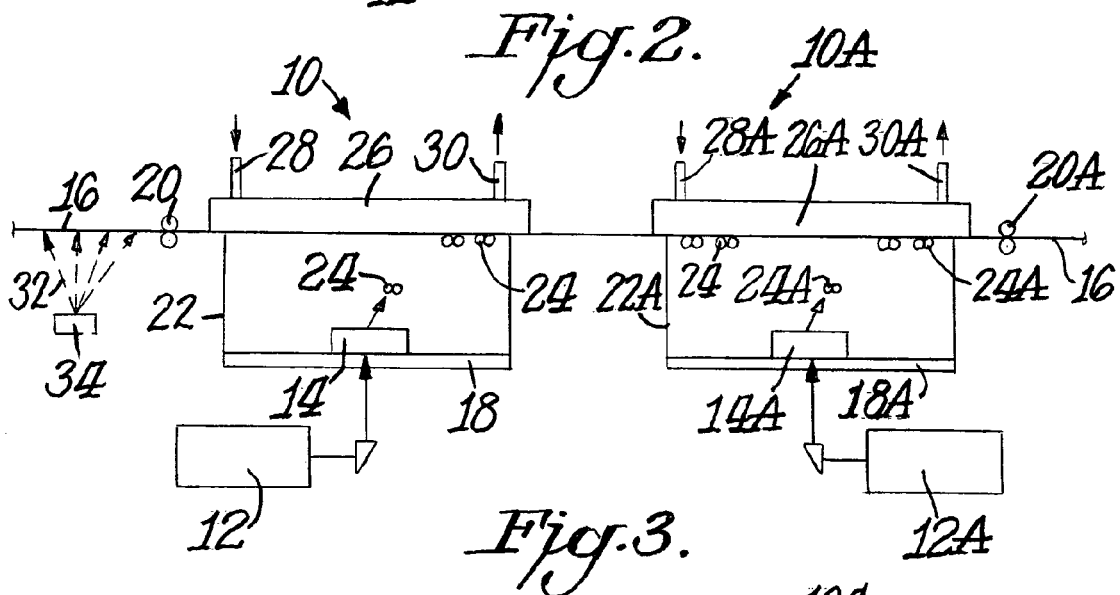
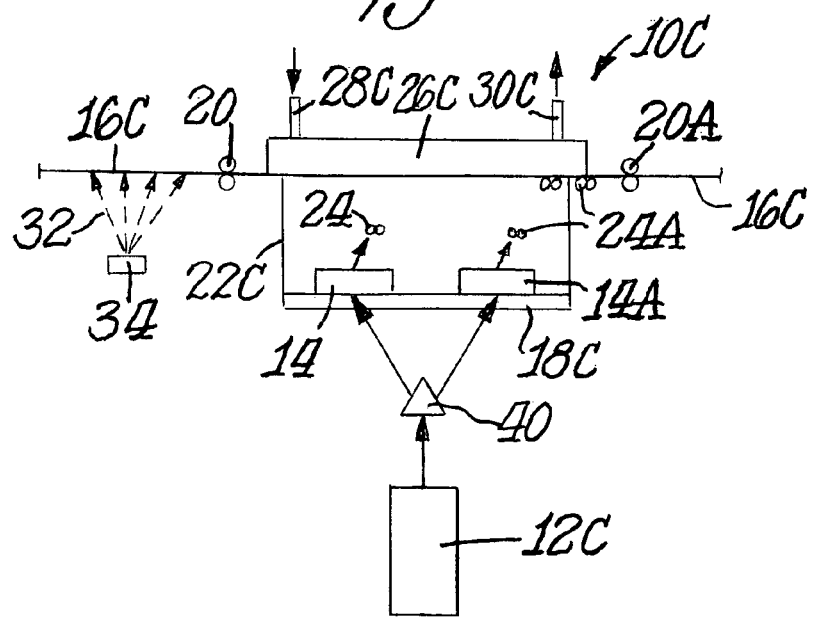

(A) *Unmodified* Cellulose Acetate Fibers (B) Surface Modified Cellulose Acetate Fibers

100 X Magnification

(A) *Untreated Cigarette* Paper

(B) Surface Modified *Cigarette Paper*

500 X Magnification

CONTINUOUS PROCESS FOR SURFACE MODIFICATION OF CIGARETTE FILTER MATERIALS

BACKGROUND OF THE INVENTION

The present invention relates to a continuous process for the surface modification of materials used in a number of products such as cigarette filters, cigarette paper, plug wrap, paper filter plug, medical applications, bandages, cosmetic and cleaning material and the like, and more particularly to such surface modification through high energy ablation and surface modification of target precursors.

To improve filtration selectivity, additives are usually physically blended with fibers used in cigarette filters. This introduces an additional complication in the filter making process that requires additional process controls and can potentially have a negative impact on throughput. For efficient selective filtration, current practice may require the use of additives in large quantities since only the outer surface of the additives may be exposed to react with tobacco smoke components during the smoking process. If large quantities of additives are needed, then effective filter design and high cost may become issues difficult to resolve. Also uniform mixing or uniform modification of the filter surface is another problem commonly associated with large amounts of additive materials. While the prior art generally teaches how to ablate material it does not address processes for forming modified cigarette filters in one step.

SUMMARY OF THE INVENTION

Accordingly, the primary object of the present invention is the production of highly efficient, selective and economical material used in the preparation of cigarette filters, cigarette paper, plug wrap, paper filter plug, and the like, and also used in the preparation of fiber reinforced composites, biomedical and catalytic applications, improved bandages and in cosmetic and cleaning materials.

In accordance with the present invention, a single selective material or multiple selective materials are anchored onto a filter support in single or multiple steps and in a continuous process. Because of the scale and dispersion uniformity of the anchored matter, its filtration efficiency is greater compared to a bulk addition by physical blending. Overall the process of modifying the filter material and modifying the filter is completed in a single step. Another advantage of the process is that it is a dry process since it does not require a carrier solvent as the case may be for spray or wet foam application of additives. The surface modification process of filter materials may also be connected in-line to the process forming the actual filter construction. The active filtration material may be a single component system in fibrous form that can easily be handled by existing filtration making equipment. Moreover, added mass is reduced thus eliminating complex filter designs. High molecular weight species are anchored onto the filter thus reducing the possibility of extra movement into the cigarette mainstream smoke which might be the case with physical blending. Specifications could also be drawn for the application of single component species and verified during production.

Another objective of the present invention is the modification of the surface of synthetic or natural fibers or cigarette paper, or filter or tipping paper used in the production of cigarettes or other smoking articles. A high energy source such as a laser is used to vaporize or ablate target precursors. The laser causes the target material to ablate, evaporate or fragment resulting in the formation of atomic or molecular species. These species recombine in a region close to the target to form corresponding modification additive materials. The modification additives may then be carried by a convective or forced flow to the vicinity of a cold plate where they condense onto the surface of a filter material which is continuously fed through a process reaction zone. A modified surface filter material emerges at the other end of the processing unit.

Functional groups could potentially improve filter selectivity towards specific compounds in cigarette mainstream smoke. Modifications of the surface of the filter material may also have other implications besides improved filtration, such as improved compatibility in composite materials, improved wettability, etc.

The process of the present invention is also extendable to a multiple chamber setup in which the same fiber or paper substrate may be fed through different chambers where multiple modification additives each having a high filtration efficiency towards a particular group of compounds may be deposited onto the same fiber or paper substrate.

As an alternative to thermal convection, other means such as an electric or magnetic field, for example, may be used to condense or attach the ablated matter to the surface of the fiber or paper substrate. The surface could be pretreated prior to the main surface modification treatment to assure improved adhesion of the ablated matter onto the substrate. For example, spraying with a plasticizer or solvent may be used to improve the stickiness of the substrate. Corona treatment or other methods may also be used to change the reactivity or wettability of the substrate prior to the main processing step. A surface treatment could be applied past the first stage of modification as necessitated by a second stage or subsequent process steps and end use requirements.

The precursor being deposited on the fiber or paper substrate can be organic or inorganic in nature. The use of organic precursors may lead to the attachment of species with certain functionalities onto the surface of the modified substrate. These functionalities may selectively react for the filtration of particular cigarette smoke components. Inorganic precursors may lead to the formation of condensed nanoscale material on the modified substrate. These structures may have improved selectivity or reactivity or catalytic activity towards selective components present in cigarette smoke. Multiple target materials each of different nature may lead to the precipitation or formation of solid solutions or alloys with unique properties. Organometallic precursors may also be used and the process can occur under a blanket of inert atmosphere.

BRIEF DESCRIPTION OF THE DRAWINGS

Novel features and advantages of the present invention in addition to those mentioned above will be readily apparent to persons of ordinary skill in the art from a reading of the following detailed description in conjunction with the accompanying drawings wherein similar reference characters refer to similar parts and in which:

FIG. 1 is a front elevational view illustrating continuous modification of filter material through high energy ablation and surface modification of target precursors, according to the present invention;

FIG. 2 is a front elevational view of an alternate embodiment illustrating continuous modification of filter material, according to the present invention;

FIG. 3 is a front elevational view of still another embodiment of the present invention;

DETAILED DESCRIPTION OF THE INVENTION

Figure 4:
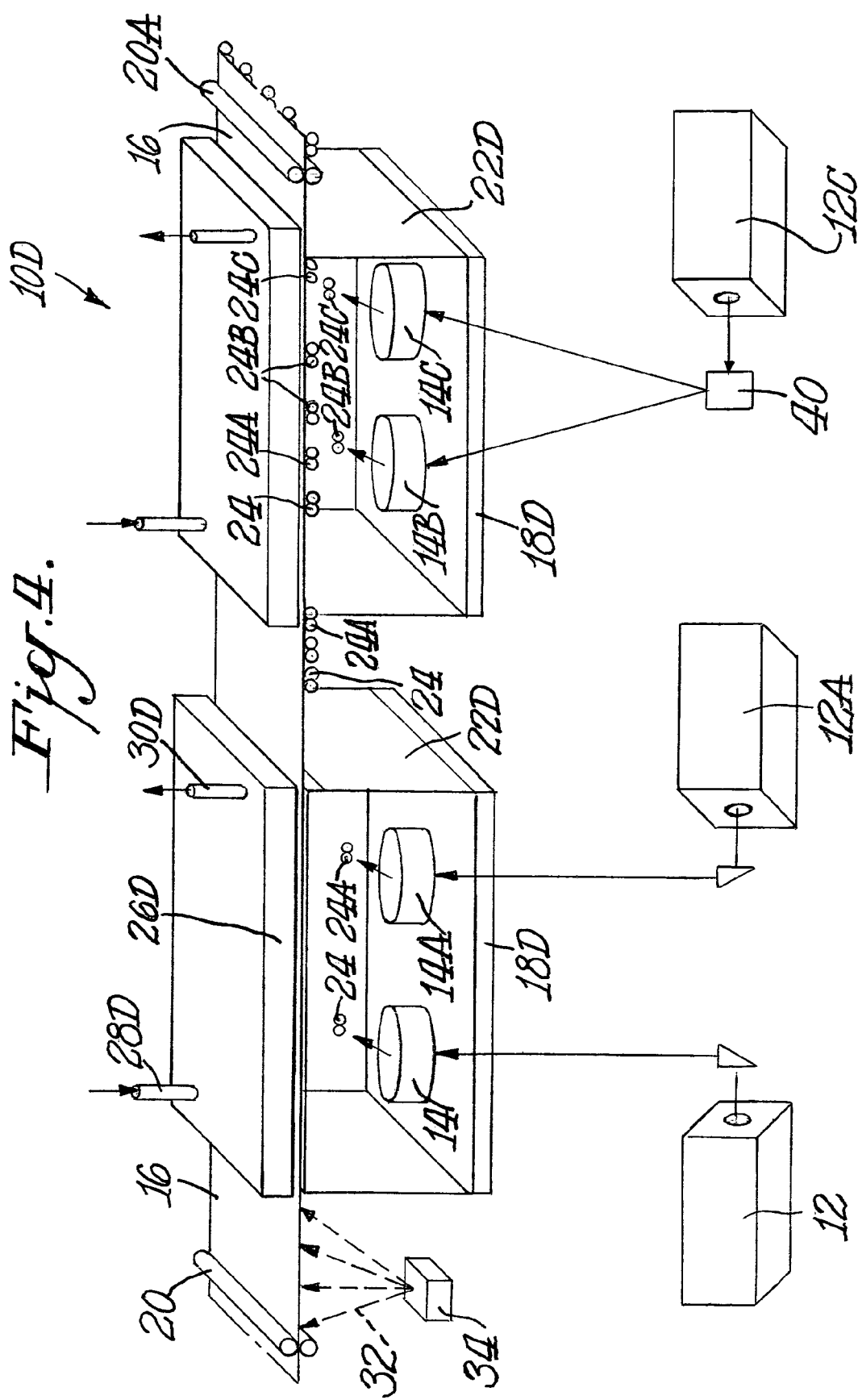
FIG. 4 is a perspective view of another embodiment of the present invention for the continuous modification of filter material.

Referring in more particularly to the drawings, FIG. 1 shows filter material used in cigarette smoke filtration or other filter applications where the surfaces thereof are modified in a continuous manner in a reactor 10. A laser 12 or other source of energy vaporizes matter from a target material 14 and such matter is directed to condense onto or react with the surface of a continuously moving fibrous web or cigarette paper 16. Material 14 rests on a heated bottom plate 18, and an electrical heating system or IR heater may be used to heat the plate. Roller pairs 20, 20A move the substrate 16 along its path of travel.

Bulk target 14 is hit by the laser 12 in a reaction chamber 22 within which the environment is controlled. The environment can be an inert atmosphere such as argon or helium. Also, reactive environments such as mixtures of oxygen with inert gases and mixtures of nitrogen or mixtures of organic compounds with inert gases may be used.

The laser 12 causes the target material 14 to ablate, evaporate or fragment resulting in the formation of atomic or molecular species 24. These species recombine in a region close to the target 14 to form corresponding modification additive materials. The species 24 recombined as modification additive materials are then carried away by a convective or forced flow to the vicinity of a cold plate 26 where they condense onto the continuously moving fibrous web or cigarette paper 16. A cooling medium such as liquid nitrogen circulates through the cold plate 26 to maintain a desired temperature. An inlet 28 and outlet 30 are provided for this purpose. Alternatively, top plate 26 may be cooled using an assembly of Peltier chips, heat exchangers, and the like.

The fibrous web or paper substrate 16 may be treated with a plasticizer or solvent 32 by spraying from a source 34 prior to interaction of the web substrate with the modification additive materials in the coating reactor 22 to thereby facilitate adhesion. The modified filter material 16 can be tailored with selectivity towards components present in smoke. Nanoscale particles with catalytic activity towards smoke components, or other heavy condensible molecules with chemical functionalities suitable to react (e.g. amine functional groups could react with aldehydes) with components present in smoke can be attached to the fibrous web or cigarette paper. This is a one step processing for modified filters with improved filtration selectivities.

In accordance with the present invention, more than one type of particle may be condensed onto the same fibrous web or cigarette paper. As shown in FIG. 2, the material processed as described above may then be fed into a second chamber 22A where a different material 14A may be ablated by a laser 12A. The resulting modification additives are then deposited onto the same fibrous web or cigarette paper 16.

Such an arrangement is shown in FIG. 2 where similar reference characters have been employed to identify similar parts. The second chamber 22A includes a different bulk target material 14A resting on hot plate 18A and laser 12A causes the target material 14A to ablate, evaporate or fragment resulting in the formation of atomic or molecular particles 24A. These particles recombine in a region close to target 14A where they form corresponding modification additive materials. These modification additive materials are then carried away by a convection or forced flow to the vicinity of cold plate 26A where they condense onto the continuously moving fibrous web or cigarette paper 16 which has already been coated with modification additive material from the bulk target 14 in the first reaction chamber 22.

FIG. 3 illustrates another embodiment of the present invention where similar reference characters have been used to identify similar parts and where a single reactor 10C includes multiple bulk target materials such as 14, 14A within a reactive chamber 22C. The bulk targets 14, 14A rest on hot plate 18C. In this embodiment of the present invention, laser light from a single laser 12C is split into multiple beams utilizing beam splitter 40 and each of the split beams is focused onto one of the bulk targets 14, 14A. Laser 12C causes the target material 14, 14A to ablate, evaporate or fragment thereby resulting in the formation of atomic or molecular species 24, 24A, and these species are ultimately carried away by convection or forced flow to the vicinity of cold plate 26C where they condense onto the continuously moving fibrous web or cigarette paper 16C.

FIG. 4 illustrates still another embodiment of the present invention and similar reference characters have been used to identify similar parts. Fundamentally, the reactor arrangement 10D shown in FIG. 4 comprises two reaction chambers 22D each of which includes multiple bulk target material resting upon hot plate 18D. The first chamber may include material such as 14, 14A while the downstream second chamber includes bulk target material 14B, 14C. Laser 12 causes the target material 14 to ablate, evaporate or fragment which results in the formation of atomic or molecular particles 24. These particles recombine and form modification additive materials which are carried away to the vicinity of cold plate 26D where they condense onto continuously moving fibrous web or cigarette paper 16. Similarly, laser 12A causes the target material 14A to ablate, evaporate or fragment thereby producing atomic particles 24A which are ultimately deposited upon the substrate 16.

Laser 12C associated with the second reaction chamber 22D emits a beam which is split by splitter 40 into two beams directed onto target materials 14B and 14C. These beams cause the target materials 14B, 14C to ablate, evaporate or fragment and the formed atomic or molecular particles 24B, 24C are ultimately deposited upon the substrate 16.

The material deposited onto the fiber or cigarette paper substrates may be inorganic or organic in nature.

Inorganic targets can include metals, mixed metals, rare earths (also oxides, mixed oxides, carbonates, sulphates and nitrates of all these) and organometallic precursors. If the targets are in their powdered form they can be compressed into a solid pellet and the solid pellet can then be used as a target.

Organic targets include but are not limited to porphyrins, alkaloids, nicotinic acid, caffeic acid, vanillic acid, pyrazinoic acid, biomolecules such as hemoglobin, myoglobin, enzymes, etc., carbohydrate based materials or cellulose and modified cellulose based materials, alginates, pectins, polymers such as polyamides, polyimides, polysulfones, polycarbonates, polymethylmethacrylate, polyethylene, polypropylene, novolac epoxy, polyesters, polyvinylacetates, polystyrene, etc. and copolymers of the above polymers. Also, polymer targets may be mixed with fine metal powders.

Desorption of large organic molecules can be induced by laser radiation. According to one previously described mechanism, molecules can be thermally desorbed from solid surfaces as these surfaces adsorb the laser radiation and heat up on time scales comparable to the laser pulse lengths. Depending on the energy level heating the target, target decomposition and desorption may occur simultaneously. Several outcomes as a result of laser-solid interactions based on the level of laser irradiance and the optical adsorption coefficient of the solid substrate include surface heating with thermal desorption, surface melting with surface evaporation, volume evaporation, formation of an optically thick plume, plasma absorption in the plume and optical breakdown.

For substrates with low adsorption coefficients at the selected laser wavelength, the transfer of large molecules in the gas phase can be enhanced by combining the target substance in a matrix with a substance having a high adsorption coefficient.

A mechanism may be used for irradiation of polymers by UV-lasers where monomer units coherently leave the bulk of the solid following instantaneous excitation to a repulsive antibonding state.

Disintegration via mechanical stress and shock following thermal expansion upon energy adsorption from the laser pulse is also possible. The depth of ablation depends on the adsorption coefficient of the substrate, the laser wavelength and its pulse duration. During single-shot excimer laser ablation of thick polymer resists on metallic substrates, an "inside-out" ablation process may occur where the polymer flies off in the form of films or filaments.

Polymer targets may be mixed with fine metal powders to assist in the molecular transfer through ablation. This may also contribute to synergistic effects on the application potential of the modified targets. For instance, the metal may have catalytic properties while the adsorbed organic phase may have selective chemisorptive properties.

Possibilities may exist to also use the modified fibers to enhance compatibility in fiber reinforced composites or in biomedical applications for scaffolds or as improved bandages or in catalytic applications. Moreover, the modified fibers may be used in cosmetics and cleaning materials.

A wide variety of lasers such as Nd:YAG lasers, excimer lasers, dye lasers, gas lasers and diode array lasers can be used. Each of these lasers may be operated in continuous or pulsed modes. The choice of the laser depends on the material that is being ablated as each material has variable cross sections of absorption for laser light at different wavelengths. One ideal laser would be one that delivers light of a wavelength that is in the region where the absorption cross section of the material is the maximum.

For most inorganic targets, laser light of 532 nm generated from the second harmonic of a Nd:YAG laser is preferred while for most organic materials laser light from either a excimer (e.g. KrF 248 nm; ArF 193 nm) or laser light from the fourth harmonic of a Nd:YAG laser (266 nm) will be preferred.

The targets could be as small as 1 cm and as large as 5 meters but preferably smaller than 1×1 feet.

The laser light may be directly projected on to the target or passed through a focusing lens prior to projection on to the target. The targets may be continuously rotated or moved vertically and horizontally to prevent erosion of the target surface.

As described above and as shown in FIGS. 3 and 4, more than one target can be placed in each chamber and multiple lasers may be used to ablate each target separately. In an alternate approach the laser light from one laser maybe split into multiple beams (two to six) using a beam splitter setup and then each of the split beams may be focused onto a target.

When the exiting material 16 is a modified filter fiber mat it may be directly rolled into a filter so as to trap the embedded particles within the filter. The modified filter could then be provided to a cigarette making machine for attachment to the tobacco rod portion of a cigarette to form a complete cigarette.

When the substrate is a cigarette paper 16, during the surface modification process the inner side of the paper will be exposed so that deposition of the materials takes place on to the inner side of the cigarette paper only. The exiting material 16, which is a modified cigarette paper may be fed to a cigarette making machine which wraps the modified paper around a tobacco column to form the tobacco rod of a cigarette. The modified surface of the cigarette paper may be on the inside or towards the tobacco rod.

When the substrate comprises a fiber mat, fibers similar to the ones used in the cigarette making process may be used such as a cellulose acetate tow. Nonwovens composed of polyester, polyamide, etc or spunbonded webs composed of polyethylene or other thermoplastics may also be utilized.

Figure 5:
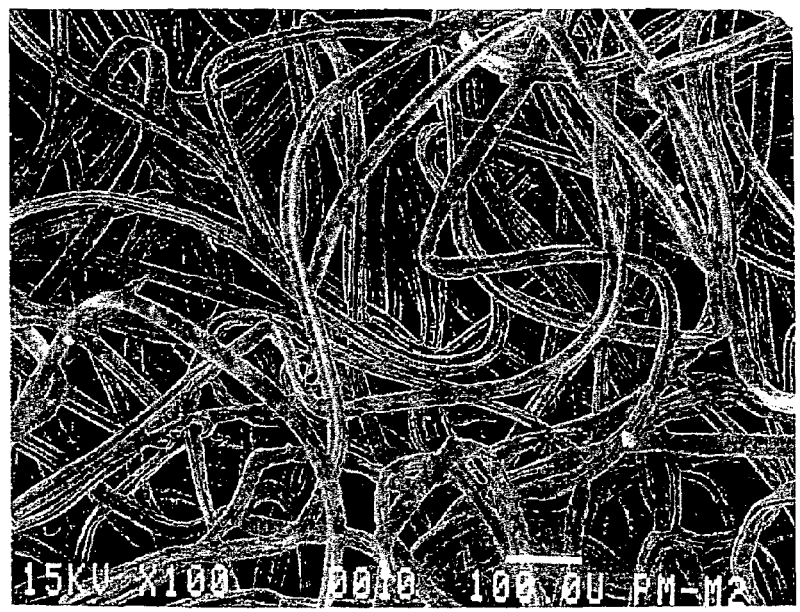
FIG. 5 is a microscopic view of untreated cellulose acetate fibers.
Figure 6:
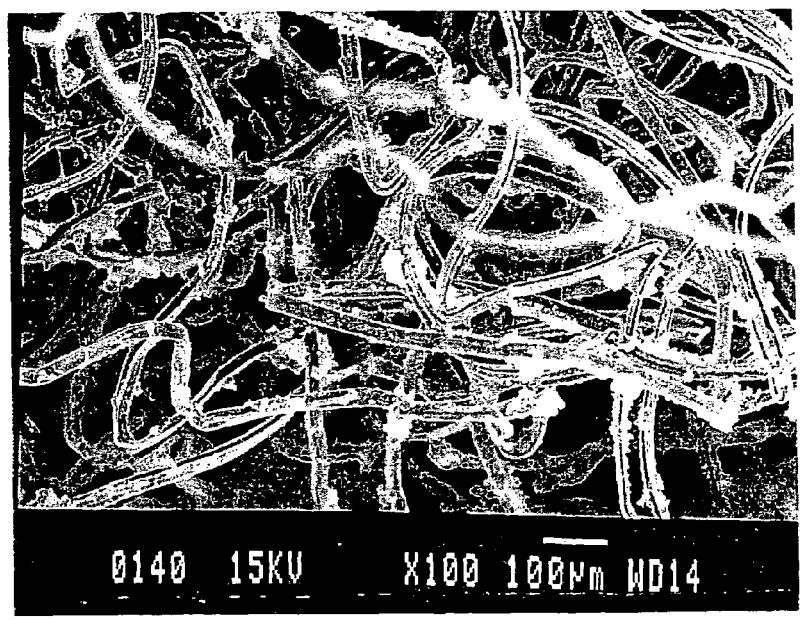
FIG. 6 is a microscopic view of surface modified cellulose acetate fibers, according to the present invention.
Figure 7:
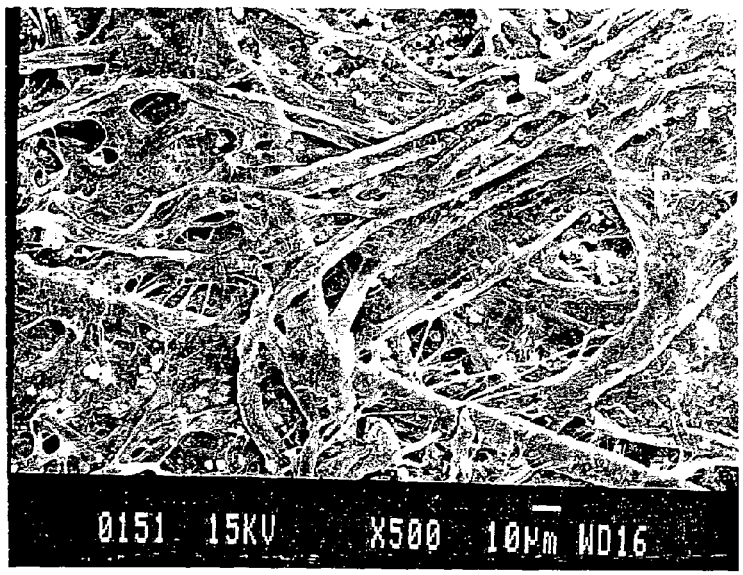
FIG. 7 is a microscopic view of untreated cigarette filler paper.
Figure 8:
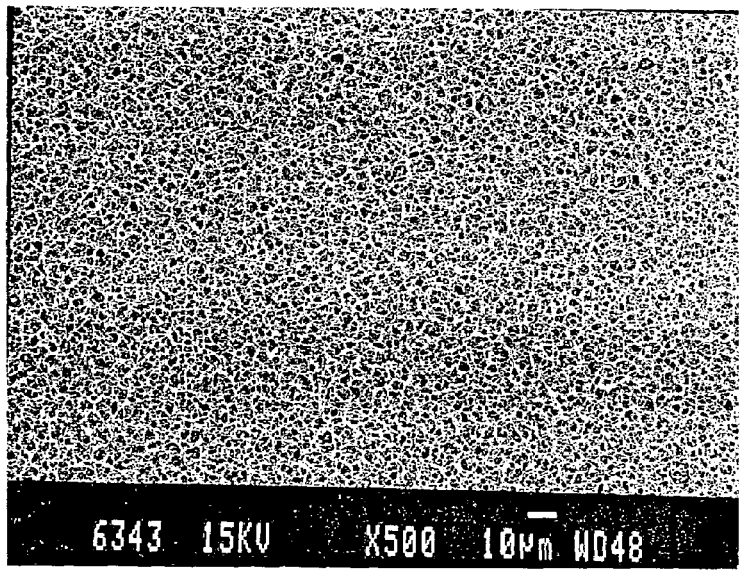
FIG. 8 is a microscopic view of surface modified cigarette paper, according to the present invention.

FIGS. 5 and 6 dramatically show cellulose acetate fibers prior to surface modification of the fibers and cellulose acetate fibers including surface modification according to the present invention. Similarly, FIGS. 7 and 8 show cigarette paper without modification and filler paper with surface modification according to the present invention.

The process for depositing target materials onto the surface of a moving substrate may be connected on-line to a process of forming an actual filter construction for a cigarette from the substrate with modification additives thereon. Alternatively, the process for depositing target materials onto the surface of a moving substrate may include the step of feeding the substrate with modification additives thereon to a cigarette making machine which wraps the substrate around a tobacco column to thereby form a tobacco rod of a cigarette.

What is claimed is:

1. An on line process for fabricating modified cigarette components by depositing target materials onto the surface of a moving substrate comprising the steps of:
   providing at least one reaction chamber having a hot region and a cold region;
   placing at least one target material in the hot region of the reaction chamber;
   continuously moving a flat planar substrate through the cold region of the reaction chamber;
   directing a laser beam onto the target material to ablate, evaporate or fragment the material and thereby producing modification additives from the target material; and
   generating a convection flow within the reaction chamber; and
   flowing the modification additives by the convection flow onto the surface of the substrate for adherence thereto.

2. A process according to claim 1 including the step of connecting on-line a process of forming an actual filter construction for a cigarette from the substrate with modification additives thereon.

3. A process according to claim 1 including the step of feeding the substrate with modification additives thereon to a cigarette making machine which wraps the substrate around a tobacco column to form a tobacco rod of a cigarette.

4. A process according to claim 1 wherein the substrate is a synthetic or natural fiber.

5. A process according to claim 1 wherein the substrate comprises cellulose acetate tow.

6. A process according to claim 1 wherein the substrate is a cigarette filter paper or cigarette tipping paper.

7. A process according to claim 1 including the step of pretreating the substrate by spraying a plasticizer or solvent thereon prior to flowing the modification additives thereon.

8. A process according to claim 1 including the step of pretreating the substrate by corona treatment or other methods to improve wettability prior to flowing the modification additives thereon.

9. A process according to claim 1 wherein the substrate is selected from the group consisting of unmodified cigarette filter paper and tipping paper.

10. A process according to claim 1 wherein the substrate is a synthetic or natural fiber, and including the step of incorporating the fiber in a composite.

11. A process according to claim 1 wherein the substrate is a synthetic or natural fiber, and including the step of forming the fiber into a bandage.

12. A process for depositing target materials onto the surface of a moving substrate comprising the steps of:
   providing at least one reaction chamber having a hot region and a cold region;
   placing at least one target material in the hot region of the reaction chamber;
   continuously moving a substrate through the cold region of the reaction chamber;
   directing a laser beam onto the target material to ablate, evaporate or fragment the material and thereby producing modification additives from the target material; and
   flowing the modification additives onto the surface of the substrate for adherence thereto, and wherein the target material is organic.

13. A process according to claim 1 wherein the target material is inorganic.

14. A process for depositing target materials onto the surface of a moving substrate comprising the steps of:
   providing at least one reaction chamber having a hot region and a cold region;
   placing at least one target material in the hot region of the reaction chamber;
   continuously moving a substrate through the cold region of the reaction chamber;
   directing a laser beam onto the target material to ablate, evaporate or fragment the material and thereby producing modification additives from the target material; and
   flowing the modification additives onto the surface of the substrate for adherence thereto, and
   wherein the target material is a polymer mixed with a fine metal powder.

15. A process according to claim 1 wherein the target material is an organometallic.

16. A process for depositing target materials onto the surface of a moving substrate comprising the steps of:
   providing at least one reaction chamber having a hot region and a cold region;
   placing at least one target material in the hot region of the reaction chamber;
   continuously moving a substrate through the cold region of the reaction chamber;
   directing a laser beam onto the target material to ablate, evaporate or fragment the material and thereby producing modification additives from the target material; and
   flowing the modification additives onto the surface of the substrate for adherence thereto, and wherein the target material is a carbohydrate based material.

17. A process according to claim 1 wherein the modification additives are organic.

18. A process according to claim 1 wherein the modification additives are inorganic.

19. A process according to claim 1 wherein the modification additives comprise a polymer mixed with a fine metal powder.

20. A process according to claim 1 wherein the ablation, evaporation or fragmentation is carried out in an inert gas environment.

21. A process according to claim 20 wherein the inert gas environment is selected from the group consisting of air, a mixture of nitrogen with inert gases, oxygen with inert gases and organic compounds with inert gases.

22. A process according to claim 1 wherein the modification additives have high selective efficiency towards a particular group of compounds present in cigarette smoke.

23. A process as in claim 1 wherein the convection flow is generated by a temperature gradient between top and bottom regions of the chamber.

24. A process as in claim 1 wherein the convention flow is generated by an electric or magnetic field.

* * * * *